United States Patent [19]

Sekiya

[11] Patent Number: 5,340,685
[45] Date of Patent: Aug. 23, 1994

[54] LIGHT-SENSITIVE COMPOSITION CONTAINING DIAZO RESIN, POLYURETHANE RESIN AND FLUORINE ATOM-CONTAINING COPOLYMER SURFACTANT

[75] Inventor: Toshiyuki Sekiya, Shizuoka, Japan

[73] Assignee: Fuji Photo Film Co., Ltd., Kanagawa, Japan

[21] Appl. No.: 40,615

[22] Filed: Mar. 31, 1993

[30] Foreign Application Priority Data

Apr. 3, 1992 [JP] Japan ................... 4-082426

[51] Int. Cl.$^5$ ............................ G03F 7/021
[52] U.S. Cl. ..................... 430/175; 430/157; 430/176; 430/281; 430/283; 430/284; 430/288; 430/906
[58] Field of Search ............... 430/175, 176, 281, 283, 430/284, 288, 906, 157

[56] References Cited

U.S. PATENT DOCUMENTS

| 4,822,713 | 4/1989 | Nishioka et al. | 430/175 |
| 4,983,491 | 1/1991 | Aoai et al. | 430/175 |
| 5,279,917 | 1/1994 | Adachi et al. | 430/175 |

FOREIGN PATENT DOCUMENTS

| 512845 | 11/1992 | European Pat. Off. |
| 3812278 | 11/1988 | Fed. Rep. of Germany |
| 63-136039 | 6/1988 | Japan |
| 1-293336 | 11/1989 | Japan |

OTHER PUBLICATIONS

WPIL Week 8930, Sep. 1989, 89-217737/30 and JPA-1-156737.

Primary Examiner—Charles L. Bowers, Jr.
Assistant Examiner—Christopher G. Young
Attorney, Agent, or Firm—Burns, Doane, Swecker & Mathis

[57] ABSTRACT

A light-sensitive composition comprises a light-sensitive diazo resin, a polymer binder and a fluorine atom-containing surfactant, wherein the polymer binder is a polyurethane resin having acidic hydrogen atom-containing substituents and comprising structural units derived from a diol represented by the following general formula (I); and the fluorine atom-containing surfactant is a copolymer of (i) an acrylate or methacrylate having a fluoroaliphatic group which has a carbon atom number of 3 to 20 and a fluorine atom content of not less than 30% by weight and in which at least three terminal carbon atoms are completely fluorinated, with (ii) poly(oxyalkylene) acrylate or poly(oxyalkylene)methacrylate, the copolymer containing the fluoroaliphatic group-containing acrylate or methacrylate units in an amount ranging from 35 to 50% by weight on the basis of the weight of the copolymer and the copolymer having has a molecular weight ranging from 20,000 to 100,000:

$$HO-(CH_2CH_2O)_n-H \qquad (I)$$

wherein n is an integer of not less than 3. The light-sensitive composition can provide a PS plate having sufficient developability with an exhausted developer and can provide a lithographic printing plate having good printing durability and excellent ink receptivity during printing even after storing under high temperature and humidity conditions or after being exposed to light.

12 Claims, No Drawings

LIGHT-SENSITIVE COMPOSITION CONTAINING DIAZO RESIN, POLYURETHANE RESIN AND FLUORINE ATOM-CONTAINING COPOLYMER SURFACTANT

BACKGROUND OF THE INVENTION

The present invention relates to a light-sensitive composition and in particular to a light-sensitive composition suitably used for preparing a presensitized plate for use in making a lithographic printing plate (hereinafter referred to as "PS plate"). More specifically, the present invention relates to a light-sensitive composition which has a sufficient ability Of being developed with a so-called exhausted developer which comprises a large amount of components of light-sensitive layers dissolved therein and which can provide a lithographic printing plate having excellent printing durability and having excellent ink-receptivity during printing even after storing the lithographic printing-plate under high temperature and humidity conditions or after exposing the lithographic printing plate to indoor-light such as a fluorescent lamp.

As light-sensitive layers for so-called negative-working PS plates whose portion exposed to light is hardened through irradiation with actinic light rays, there have been known a so-called alkali-developable light-sensitive layer as disclosed in Japanese Patent Publication for Opposition Purpose (hereinafter referred to as "J.P. KOKOKU") No. Sho 55-34929(=U.S. Pat. No. 4,123,276) in which the unexposed portion is removed through development with an aqueous alkaline developer and a so-called solvent-developable light-sensitive layer as disclosed in Japanese Unexamined Patent Publication (hereinafter referred to as "J.P. KOKAI") No. Sho 56-94346(=U.S. Pat. No. 4,337,307) in which the unexposed portion is removed through development with a developer mainly comprising an organic solvent. However, the use of the alkali-developable light-sensitive layer has been the leading mainstream in this field from the viewpoint of industrial safety and health. The majority of these alkali-developable light-sensitive layers comprise combinations of diazonium compounds as light-sensitive substances and polymer binders and the alkali-developability of these light-sensitive layers is mainly determined by the properties of these polymer binders used. In general, if the alkali-developability is imparted to binders, the wear resistance of the polymers are deteriorated and accordingly the resulting lithographic printing plate has insufficient printing durability. To solve these problems, there have been proposed the use of alkali-soluble polyurethane resins as disclosed in U.S. Pat. No.4,983,491 and J.P. KOKAI Nos. Hei 1-293336 and Sho 63-136039 and these urethane polymers permit the production of PS plates which simultaneously satisfy these requirements of both alkali-developability and high printing durability. However, it has been required that these PS plates are sufficiently developable with not only fresh developers free of any component of the light-sensitive layers, but also so-called exhausted developers which are obtained after development of a large amount of PS plates and which accordingly comprise a large amount of unexposed portions of light-sensitive layers dissolved therein. Moreover, it has also been desired that a large amount of the resulting PS plates can be processed with a constant amount of a developer or that the resulting PS plates have improved developability, from the viewpoint of saving natural resources. There has thus been desired for further enhancement of alkali-developability of these PS plates.

On the other hand, the ink-receptivity of PS plates is important in addition to the foregoing developability and printing durability and there has been proposed, for instance, a method for improving ink-receptivity which comprises adding a polymer compound as disclosed in U.S. Pat. Nos. 4,294,905 and 4,902,602. However, the lithographic printing plates obtained after plate-making processes of these PS plates undergo deterioration of the ink-receptivity when they are stored under high temperature and humidity conditions or exposed to light. Thus, there has been desired for further improvement of the ink-receptivity. In addition, J.P. KOKAI No. Sho 63-136039 discloses a light-sensitive composition which is alkali-developable and has improved printing durability and ink-receptivity and which comprises a combination of a diazo resin, a polyurethane resin having carboxyl groups and/or a modified polyvinyl acetal resin having substituents carrying acidic hydrogen atoms and a fluorine atom-containing surfactant. However, the polymer binder used in the light-sensitive composition does not provide a PS plate capable of being developed with an exhausted developer and further the PS plate obtained from such a light-sensitive composition cannot provide, after a plate-making process, a lithographic printing plate having sufficient ink-receptivity. In other words, the ink-receptivity of the lithographic printing plate is insufficient when it is stored under high temperature and humidity conditions and the portions thereof exposed to light have low ink-receptivity.

SUMMARY OF THE INVENTION

Accordingly, it is an object of the present invention to provide a light-sensitive composition which is alkali-developable, can provide a PS plate having sufficient developability with a so-called exhausted developer containing a large quantity of components of the light-sensitive layers while exhibiting good processability and which can provide a lithographic printing plate having excellent printing durability and ink-receptivity during printing, in particular, excellent ink-receptivity even after the lithographic printing plate is stored under high temperature and humidity conditions and is exposed to light.

The present invention has been completed on the basis of the finding that the foregoing object can be accomplished by simultaneously using a light-sensitive diazo resin, a specific alkali-soluble polyurethane resin and a specific fluorine atom-containing surfactant.

The present invention thus relates to a light-sensitive composition which comprises a light-sensitive diazo resin, a polymer binder and a fluorine atom-containing surfactant, wherein the polymer binder is a polyurethane resin having acidic hydrogen atom-containing substituents and comprising structural units derived from a diol represented by the following general formula (1); and the fluorine atom-containing surfactant is a copolymer of (i) an acrylate or methacrylate having a fluoroaliphatic group which has a carbon atom number of 3 to 20 and a fluorine atom content of not less than 30% by weight and in which at least three terminal carbon atoms are completely fluorinated, with (ii) poly(oxyalkylene) acrylate or poly(oxyalkylene)methacrylate, the copolymer containing the fluoroaliphatic group-containing acrylate or methacrylate units in an amount ranging from 35 to 50% by weight on the basis of the weight of the copolymer and the copolymer having a molecular weight ranging from 20,000 to 100,000:

$$HO-(CH_2CH_2O)_n-H \qquad (1)$$

wherein n is an integer of not less than 3.

DESCRIPTION OF THE PREFERRED EMBODIMENTS

The light-sensitive composition of the present invention will hereinafter be explained in more detail.

The diazo resins used in the present invention preferably include, for instance, inorganic salts of diazo resins which are organic solvent-soluble reaction products of condensates of p-diazodiphenylamine and formaldehyde or acetaldehyde with hexafluorophosphates and tetrafluoroborates; reaction products of the foregoing condensates with sulfonates such as p-toluenesulfonic acid or salts thereof, phosphinates such as phosphinic acid or salts thereof, or hydroxyl group-containing compounds such as 2,4-dihydroxybenzophenone, 2-hydroxy-4-methoxybenzophenone-5-sulfonic acid or salts thereof as disclosed in U.S. Pat. No. 3,300,309; organic solvent-soluble diazo resins as disclosed in J.P. KOKAI Nos. Sho 58-209733, Sho 62-175731 and Sho 63-26264 which are reaction products of the foregoing condensates with sulfonic acids having long chain alkyl groups; and organic solvent-soluble diazonium salt condensates disclosed in U.S. Pat. No. 3,867,147.

In addition, examples preferably used further include diazo resins prepared through ring-opening reactions of the condensates with epoxy resins as disclosed in J.P. KOKAI Nos. Hei 4-338756 and 4-347856 and through reactions of the condensates with olefinically unsaturated compounds as disclosed in J.P. KOKAI No. Sho 58-187925.

Other diazo resins preferably used in the present invention include, for instance, co-condensed diazo resins comprising structural units derived from aromatic compounds having at least one group selected from the group consisting of carboxyl group, sulfonate residue, sulfinate residue and phosphorus atom-containing oxy acid groups (hereinafter referred to as "acid groups") and aromatic diazonium compounds. Examples of preferred acid group-containing aromatic compounds are those disclosed in J.P. KOKAI Nos. Hei 2-253857 and Hei 4-211253, in particular 4-methoxybenzoic acid, p-hydroxybenzoic acid, phenoxy acetic acid and phenylphosphoric acid. The aromatic diazo compounds are, for instance, those disclosed in U.S. Pat. No. 3,867,147, with diazo compounds derived from 3-methoxy-4-amino-4-diphenylamine and 4-aminodiphenylamine being particularly preferred.

The foregoing co-condensed diazo resins can be prepared by conventionally known methods such as those disclosed in Photo. Sci. Eng., 1973, 17, p. 33, U.S. Pat. Nos. 2,063,631; 2,679,498 and 3,679,419 and British Patent No. 1,312,926.

The molar ratio of the acid group-containing aromatic compound to the aromatic diazo compound to be charged ranges from 1:0.1 to 0.1:1, preferably 1:0.5 to 0.2:1 and more preferably 1:1 to 0.2:1.

In addition to the co-condensation of the condensates with the foregoing acid group-containing aromatic compounds, acid groups can be incorporated into diazo resins by methods comprising condensing the condensates with acid group-containing aldehyde or acetal compounds thereof as disclosed in J.P. KOKAI Nos. Hei 4-18559(=U.S. Pat. No. 5,112,743), Hei 3-163551 and Hei 3-253857 and these diazo resins can likewise be preferably used.

Counteranions for the foregoing diazo resins are preferably those capable of stably forming salts with the diazo resins and capable of making the resins soluble in organic solvents. Examples thereof are disclosed in J.P. KOKAI Nos. Hei 2-219060 and Hei 4-172354 and U.S. Pat. No. 5,112,743 with butylnaphthalenesulfonic acid, dibutylnaphthalenesulfonic acid, hexafluorophosphoric acid, 2-hydroxy-4-methoxybenzophenone-5-sulfonic acid and dodecylbenzenesulfonic acid being particularly preferred.

Diazo resins having arbitrary molecular weights can be obtained by variously changing reaction conditions during synthesis thereof, but the diazo resins which can effectively be used in the intended applications suitably have molecular weights ranging from about 400 to 100,000 and preferably about 800 to 20,000. The foregoing diazo resins may be used alone or in combination.

The polyurethane resins used in the present invention as the polymer binders are those having acidic hydrogen atom-containing substituents and comprising structural units derived from diols represented by the foregoing general formula (1).

The incorporation of the diol component represented by Formula (1) into the light-sensitive composition permits the improvement of developability of the resulting PS plate with an exhausted developer without any deterioration of the wear resistance thereof. The term "acidic hydrogen atom-containing substituent" herein means a substituent having an acid dissociation constant (pKa) of not more than 7 such as —COOH, —SO$_2$NHCOO—, —CONHSO$_2$—, —CONHSO$_2$NH— or —NHCONHSO$_2$—, with —COOH being particularly preferred. The acid group content of the polyurethane resin preferably ranges from 0.05 to 6 meq per one gram of the resin. If it is less than 0.05 meq/g, the resulting PS plate cannot be sufficiently developed with an alkaline developer, while if it exceeds 6 meq/g, the wear resistance thereof is deteriorated. The content is more preferably 0.2 to 4 meq/g.

Specific examples of the foregoing diols represented by Formula (1) are as follows: HO—(CH$_2$CH$_2$O)$_3$—H, HO—(CH$_2$CH$_2$O)$_4$—H, HO—(CH$_2$CH$_2$O)$_5$—H, HO—(CH$_2$CH$_2$O)$_6$—H, HO—(CH$_2$CH$_2$O)$_7$—H, HO—(CH$_2$CH$_2$O)$_8$—H, HO—(CH$_2$CH$_2$O)$_{10}$—H and HO—(CH$_2$CH$_2$O)$_{12}$—H.

Particularly preferred are those in which n ranges from 3 to 6. These diols may be used alone or in combination and the content thereof in the polyurethane resin preferably ranges from 10 to 80 mole % and in particular 20 to 50 mole % on the basis of the total diol components present in the resin. If it is less than 10 mole %, the resulting PS plate is not sufficiently developed with an exhausted developer, while if it exceeds 80 mole %, the wear resistance thereof is deteriorated.

The foregoing polyurethane resins can be prepared by various methods. Examples of preferred polyurethane resins having carboxyl groups as the acidic hydrogen atom-containing substituents include those having basic skeletons derived from reaction products of diisocyanate compounds represented by the following general formula (2), diol compounds represented by the general formula (1) and carboxyl group-containing diol compounds represented by the following general formulas (3), (4) or (5):

$$\text{OCN}-R^1-\text{NCO} \quad (2)$$

$$\text{HO}-R^3-\underset{\underset{\text{COOH}}{\overset{\underset{|}{R^5}}{|}}}{\overset{\overset{R^2}{|}}{C}}-R^4-\text{OH} \quad (3)$$

$$\text{HO}-R^3-\underset{\underset{\text{COOH}}{\overset{\underset{|}{R^5}}{|}}}{\text{Ar}}-R^4-\text{OH} \quad (4)$$

$$\text{HO}-R^3-\underset{\underset{\text{COOH}}{\overset{\underset{|}{R^5}}{|}}}{N}-R^4-\text{OH} \quad (5)$$

In the foregoing general formulas, $R^1$ represents a divalent aliphatic or aromatic hydrocarbon group which may have substituents (preferably selected from, for instance, alkyl, alkenyl, aralkyl, aryl, alkoxy groups and/or halogen atoms). $R^1$ may optionally have other functional groups which are not reactive with isocyanate group, such as ester, urethane, amido, ureido groups and/or carbon-carbon unsaturated bonds.

$R^2$ represents a hydrogen atom, an alkyl, alkenyl, aralkyl, aryl, alkoxy or aryloxy group which may have substituents (preferably selected from, for instance, alkyl, aryl, alkoxy, ester, urethane, amido, ureido groups and/or halogen atoms) and preferably a hydrogen atom, an alkyl group having 1 to 8 carbon atoms, an alkenyl group having 2 to 8 carbon atoms or an aryl group having 6 to 15 carbon atoms.

$R^3$, $R^4$ and $R^5$ may be the same or different and each represents a single bond or a divalent aliphatic or aromatic hydrocarbon group which may have substituents (preferably selected from, for instance, alkyl, alkenyl, aralkyl, aryl, alkoxy groups and/or halogen atoms), preferably an alkylene group having 1 to 20 carbon atoms, an arylene group having 6 to 15 carbon atoms and more preferably an alkylene group having 1 to 8 carbon atoms. $R^3$, $R^4$ and $R^5$ may optionally have other functional groups which are not reactive with isocyanate group, such as ester, urethane, amido, ureido groups and/or carbon-carbon unsaturated bonds. In this respect, two or three of $R^2$, $R^3$, $R^4$ and $R^5$ may be bonded to form a ring.

Ar represents a substituted or unsubstituted trivalent aromatic hydrocarbon group and preferably an aromatic group having 6 to 15 carbon atoms.

Specific examples of the diisocyanate compounds represented by Formula (2) include aromatic diisocyanate compounds such as 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; aliphatic diisocyanate compounds such as hexamethylene diisocyanate, trimethylhexamethylene diisocyanate, lysine diisocyanate and dimeric acid diisocyanate; alicyclic diisocyanate compounds such as isophorone diisocyanate, 4,4'-methylenebis(cyclohexyl isocyanate), methylcyclohexane-2,4 (or 2,6)-diisocyanate and 1,3-bis(isocyanatomethyl)cyclohexane; and diisocyanate compounds obtained through reactions of diols and diisocyanates such as an adduct of 1,3-butylene glycol (1 mole) with tolylene diisocyanate (2 moles).

Specific examples of the carboxyl group-containing diol compounds represented by Formulas (3), (4) or (5) are 3,5-dihydroxybenzoic acid, 2,2-bis(hydroxymethyl)propionic acid, 2,2-bis (2-hydroxyethyl)propionic acid, 2,2-bis(3-hydroxypropyl) propionic acid, bis(hydroxymethyl)acetic acid, bis(4-hydroxyphenyl)acetic acid, 4,4-bis(4-hydroxyphenyl)pentanoic acid, tartaric acid and N,N-bis(2-hydroxyethyl)-3-carboxypropionamide.

In addition, examples of polyurethane resins carrying substituents having acidic hydrogen atoms other than carboxyl group are those comprising basic skeletons derived from reaction products of diisocyanate compounds represented by Formula (2), diol compounds represented by Formula (1) and diol compounds represented by the following general formulas (6), (7), (8) or (9):

$$\text{HO}-R^3-\underset{\underset{R^6}{\overset{\underset{|}{Y}}{|}}}{\overset{\overset{R^2}{|}}{\underset{|}{\overset{|}{C}}}}-R^4-\text{OH} \quad (6)$$

$$\text{HO}-R^3-\underset{\underset{R^6}{\overset{\underset{|}{Y}}{|}}}{\overset{\overset{R^5}{|}}{\text{Ar}}}-R^4-\text{OH} \quad (7)$$

$$\text{HO}-R^3-\underset{\underset{R^6}{\overset{\underset{|}{Y}}{|}}}{\overset{\overset{R^5}{|}}{N}}-R^4-\text{OH} \quad (8)$$

$$\text{HO}-R^3-Y-R^4-\text{OH} \quad (9)$$

wherein $R^2$, $R^3$, $R^4$, and $R^5$ and Ar are the same as those defined above. $R^6$ represents a monovalent aliphatic or aromatic hydrocarbon group which may have substituents (preferably selected from, for instance, alkyl groups, alkoxy groups and/or halogen atoms), preferably an alkyl group having 1 to 20 carbon atoms, an alkenyl group having 2 to 20 carbon atoms, an aryl group having 6 to 15 carbon atoms or an aralkyl group having 7 to 15 carbon atoms and more preferably an alkyl group having 1 to 8 carbon atoms, an alkenyl group having 2 to 8 carbon atoms or an aryl group having 6 to 10 carbon atoms.

Y represents an N-sulfonylamido group (—CO—NH—SO$_2$—), an N-sulfonylureido group (—NH—CO—NH—SO$_2$—), an N-aminosulfonylamido group (—CO—NH—SO$_2$—NH—) or a sulfonylurethane group (—O—CO—NH—SO$_2$—).

The diol compounds represented by Formulas (6), (7), (8) or (9) are synthesized by, for instance, protecting the hydroxyl groups of the carboxyl group-containing diol compounds represented by Formulas (3), (4) or (5) and then reacting them with compounds represented by the following general formulas (10), (11), (12) or (13) in the presence of bases, or further reacting the products with chlorosulfonyl isocyanate and then reacting the resulting products with amines represented by the following general formula (14):

$$R^6-SO_2-NCO \quad (10)$$

$$X-R^3-CO-NH-SO_2-R^6 \quad (11)$$

$$X-R^3-NH-CO-NH-SO_2-R^6 \quad (12)$$

$$X-R^3-CO-NH-SO_2-NH-R^6 \quad (13)$$

$$R^6-NH_2 \quad (14)$$

In the formulas, X represents a chlorine or bromine atom.

The diol compound having a sulfonylurethane group can be synthesized by reacting one of the hydroxyl groups of a trihydroxyl compound with a compound represented by Formula (10).

The compounds of Formulas (11), (12) and (13) each can be synthesized by, for instance, reacting a compound of the following formula (15) with a compound Of the following formula (16), reacting a compound of the following formula (17) with a compound of the following formula (16) or reacting a compound of the following formula (18) with chlorosulfonyl isocyanate and then reacting each reaction product with an amine compound of Formula (14):

$$X-R^3-COCl \quad (15)$$

$$R^4-SO_2-NH_2 \quad (16)$$

$$X-R^3-NCO \quad (17)$$

$$X-R^3-COOH \quad (18)$$

Moreover, the diol compounds represented by Formula (9) can be synthesized by, for instance, reacting a compound represented by Formula (15) with a compound of the following formula (19), reacting a compound represented by Formula (17) with a compound represented by Formula (19) or reacting a compound represented by Formula (19) with chlorosulfonyl isocyanate and then reacting each resulting compound with a compound of the following general Formula (20) to hydroxylate the same:

$$X-R^4-SO_2-NH_2 \quad (19)$$

$$X-R^4-NH_2 \quad (20)$$

Specific examples of the diol compounds represented by Formulas (6), (7), (8) and (9) include those listed below:

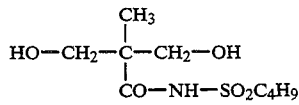 (No. 1)

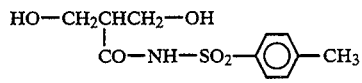 (No. 2)

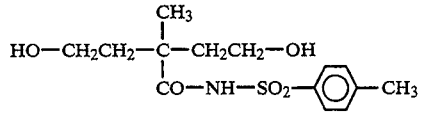 (No. 3)

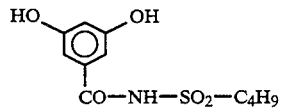 (No. 4)

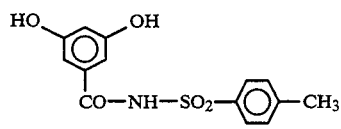 (No. 5)

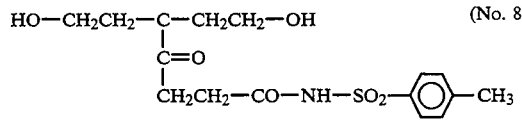 (No. 6)

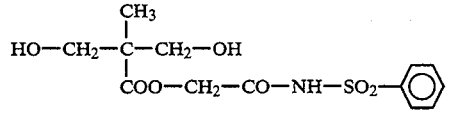 (No. 7)

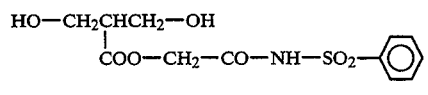 (No. 8)

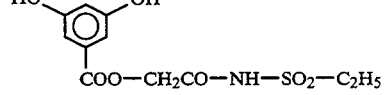 (No. 9)

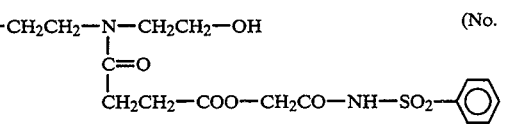 (No. 10)

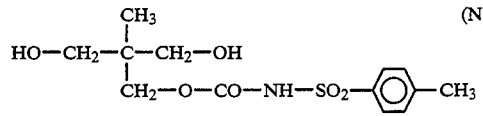 (No. 11)

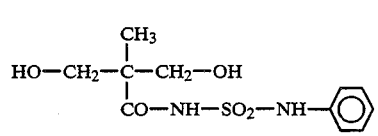 (No. 12)

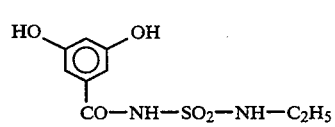 (No. 13)

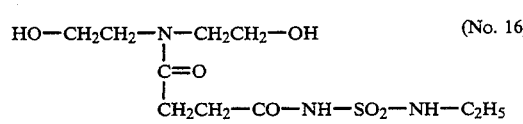 (No. 14)

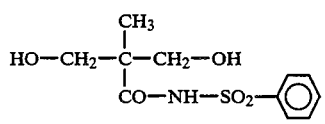 (No. 15)

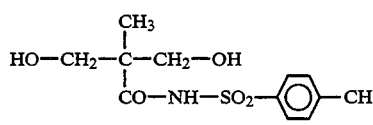 (No. 16)

$$\text{HO—CH}_2\text{—}\underset{\underset{\text{COO—CH}_2\text{CO—NH—SO}_2\text{—NH—C}_2\text{H}_5}{|}}{\overset{\overset{\text{CH}_3}{|}}{\text{C}}}\text{—CH}_2\text{—OH} \quad (\text{No. 17})$$

$$\text{HO—CH}_2\text{—}\underset{\underset{\text{COO—CH}_2\text{CO—NH—SO}_2\text{—NH—}\bigcirc}{|}}{\overset{\overset{\text{CH}_3}{|}}{\text{C}}}\text{—CH}_2\text{—OH} \quad (\text{No. 18})$$

$$\text{HO—CH}_2\text{CH}_2\text{—N—CH}_2\text{CH}_2\text{—OH} \quad (\text{No. 19})$$
$$\underset{\underset{\text{CH}_2\text{CH}_2\text{—COO—CH}_2\text{CO—NH—SO}_2\text{—NH—C}_2\text{H}_5}{|}}{\overset{|}{\text{C}=\text{O}}}$$

$$\text{HO—CH}_2\text{—}\underset{\underset{\text{COO—C}_4\text{H}_8\text{—NH—CO—NH—SO}_2\text{—}\bigcirc}{|}}{\overset{\overset{\text{CH}_3}{|}}{\text{C}}}\text{—CH}_2\text{—OH} \quad (\text{No. 20})$$

$$\text{HO—CH}_2\text{—}\underset{\underset{\text{COO—C}_4\text{H}_8\text{—NH—CO—NH—SO}_2\text{—C}_2\text{H}_5}{|}}{\overset{\overset{\text{CH}_3}{|}}{\text{C}}}\text{—CH}_2\text{—OH} \quad (\text{No. 21})$$

$$\text{HO—CH}_2\text{CO—NH—SO}_2\text{—C}_3\text{H}_6\text{—OH} \quad (\text{No. 22})$$

$$\text{HO—CH}_2\text{CO—NH—SO}_2\text{—NH—C}_2\text{H}_4\text{—OH} \quad (\text{No. 23})$$

$$\text{HO—C}_3\text{H}_6\text{CO—NH—SO}_2\text{—NH—C}_2\text{H}_4\text{—OH} \quad (\text{No. 24})$$

The polyurethane resins used in the invention can also be synthesized by reacting polyurethane resins having carboxyl groups which are reaction products of diisocyanate compounds of Formula (2), diol compounds of Formula (1) and diol compounds of Formulas (3), (4) or (5) with compounds of Formulas (10), (11), (12) or (13) in the presence of bases or alternatively reacting the foregoing resins with chlorosulfonyl isocyanate and then reacting the products with amine compounds of Formula (14).

Further, diol compounds which are free of carboxyl groups and have other substituents non-reactive with isocyanates may simultaneously be used, in combination with the aforementioned diol compounds, in an amount such that the alkali-developability of the resulting PS plate is not impaired.

Specific examples of such diol compounds include ethylene glycol, diethylene glycol, propylene glycol, dipropylene glycol, polypropylene glycol, neopentyl glycol, 1,3-butylene glycol, 1,4-butanediol, 1,5-pentanediol, 1,6-hexanediol, 2-butene-1,4-diol, 2-butyne-1,4-diol, 2,2,4-trimethyl-1,3-pentanediol, 2,2-diethyl-1,3-propanediol, 1,4-bis-β-hydroxyethoxycyclohexane, cyclohexanediol, cyclohexanedimethanol, tricyclodecanedimethanol, hydrogenated bisphenol A, diethyl 2,2-dimethylolmalonate, bis-(2-hydroxyethyl)sulfide, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinonedihydroxyethyl ether, p-xylylene glycol, dihydroxyethylsulfone, bis(2-hydroxyethyl)-2,4-tolylenedicarbamate, 2,4-tolylene-bis(2-hydroxy-ethylcarbamide), bis(2-hydroxyethyl)-m-xylylenedicarbamate and bis(2-hydroxyethyl)isophthalate.

The diol compounds other than those represented by the formulas (1) and (3) to (5) may be used in an amount of not more than 20 mol % based on the total amount of the diol compounds. A substituent having an acidic hydrogen atom: —SO$_2$NHCOO— can be introduced into the polyurethane resin of the present invention through the reaction of remaining -OH groups of the resin with a compound of Formula (10).

The polyurethane resins used in the invention can be synthesized by heating the foregoing diisocyanate compounds and diol compounds in an aprotic solvent in the presence of a catalyst which is selected depending on the reactivities of these reactants and has a known activity, such as diethylaniline, 2,2,2-diazabicyclooctane or di-n-butyl tin dilaurate. The molar ratio of the diisocyanate to the diol compounds used preferably ranges from 0.8: 1 to 1.2:1. If isocyanate groups remain at the ends of the resulting polymers, they can be treated with alcohols or amines to finally give polymers free of terminal isocyanate groups.

The molecular weight of the polyurethane resins used in the invention is preferably not less than 1,000 and more preferably 5,000 to 200,000 expressed in terms of weight-average molecular weight.

These polyurethane resins may be used alone or in combination. The content of these polyurethane resins in the light-sensitive composition is not less than 50% by Weight, preferably 50 to 95% by weight and most preferaly about 60 to 90% by weight.

The polyurethane resins used in the invention can specifically be synthesized according to the following Preparation Examples.

PREPARATION EXAMPLE 1

To a 500 ml volume, three-necked round flask equipped with a condenser and a stirring machine, there were added 14.6 g (0.109 mole) of 2,2-bis(hydroxymethyl)propionic acid, 13.3 g (0.0686 mole) of tetraethylene glycol and. 2.05 g (0.0228 mole) of 1,4-butanediol and these compounds were dissolved in 118 g of N,N-dimethylacetamide. To the resulting solution, there were added 30.8 g (0.123 mole) of 4,4'-diphenylmethane diisocyanate, 13.8 g (0.0819 mole) of hexamethylene diisocyanate and 0.1 g of di-n-butyl tin dilaurate as a catalyst and the mixture was heated at 90° C for 7 hours with stirring. To this reaction solution, there were added 100 ml of N,N-dimethylacetamide, 50 ml of methanol and 50 ml of acetic acid, followed by stirring of the mixture and addition of the mixture to 4 l of water with stirring to give white polymer particles. The resulting polymer was filtered, washed with water and then dried under reduced pressure to give 60 g of a polymer (polyurethane (a)).

The molecular weight (weight-average molecular weight; polystyrene standard) of this polymer was determined by gel permeation chromatography (GPC) and was found to be 70,000. In addition, the carboxyl group content thereof was determined by titration and found to be 1.43 meq/g.

PREPARATION EXAMPLES 2 TO 6

Polyurethane resins (b) to (f) were prepared in the same manner used in Preparation Example 1 using diisocyanates listed in Table 1 and diol compounds listed in Table 2. The acid contents thereof determined by titration and the molecular weights thereof determined by GPC are also listed in Table 2.

COMPARATIVE PREPARATION EXAMPLES 1 TO 2

By way of comparison, there were prepared polyurethane resins (g) and (h) free of the diol component of Formula (1). The diisocyanates used are listed in Table 3 and the diol compounds used, the acid contents and the molecular weights thereof are summarized in Table 4.

TABLE 1

| Pre. Ex. | Polyurethane Resin | Diisocyanate Compounds Used (mole %) |
|---|---|---|
| 2 | b | OCN—⌬—CH$_2$—⌬—NCO (70)    OCN(CH$_2$)$_6$NCO (30) |
| 3 | c | 5-isocyanato-1-(isocyanatomethyl)-1,3,3-trimethylcyclohexane-type structure (50)    p-xylylene diisocyanate (CH$_2$NCO / CH$_2$NCO) (50) |
| 4 | d | OCN—⌬—CH$_2$—⌬—NCO (80)    OCN(CH$_2$)$_6$NCO (20) |
| 5 | e | 1,5-naphthalene diisocyanate (30)    OCN(CH$_2$)$_6$NCO (70) |
| 6 | f | 2,4-tolylene diisocyanate: OCN—⌬(CH$_3$)—NCO (100) |

TABLE 2

| Pre. Ex. | Polyurethane Resin | Diol Compound Used (mole %) | Acid-Content (meq/g) | Mw |
|---|---|---|---|---|
| 2 | b | HO—⌬(OH)—COOH (60)    HO(CH$_2$CH$_2$O)$_3$H (40) | 1.68 | 80,000 |
| 3 | c | HO—⌬—CH(COOH)—⌬—OH (50)    HO(CH$_2$CH$_2$O)$_4$H (50) | 1.20 | 60,000 |
| 4 | d | HOCH$_2$—C(CH$_3$)(COOH)—CH$_2$OH (65)    HO(CH$_2$CH$_2$O)$_4$H (35) | 1.68 | 120,000 |
| 5 | e | HOCH$_2$C(CH$_3$)(COOC$_4$H$_9$NHCONHSO$_2$—⌬)CH$_2$OH (80)    HO(CH$_2$CH$_2$O)$_4$H (20) | 1.60 | 32,000 |

TABLE 2-continued

| Pre. Ex. | Polyurethane Resin | Diol Compound Used (mole %) | Acid Content (meq/g) | Mw |
|---|---|---|---|---|
| 6 | f | 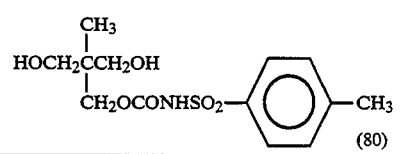 HOCH$_2$CCH$_2$OH with CH$_3$ and CH$_2$OCONHSO$_2$—C$_6$H$_4$—CH$_3$ (80)   HO(CH$_2$CH$_2$O)$_6$H (20) | 1.66 | 30,000 |

TABLE 3

| Comp. Pre. Ex. | Polyurethane Resin | Isocyanate Compounds Used (mole %) |
|---|---|---|
| 1 | g | OCN—C$_6$H$_4$—CH$_2$—C$_6$H$_4$—NCO (60)   OCN(CH$_2$)$_6$NCO (40) |
| 2 | h | OCN—C$_6$H$_4$—CH$_2$—C$_6$H$_4$—NCO (80)   OCN(CH$_2$)$_6$NCO (20) |

TABLE 4

| Pre. Ex. | Polyurethane Resin | Diol Compound Used (mole %) | Acid Content (meq/g) | Mw |
|---|---|---|---|---|
| 1 | g | HOCH$_2$C(CH$_3$)(COOH)CH$_2$OH (54)   HO(CH$_2$)$_4$OH (46) | 1.63 | 70,000 |
| 2 | h | HOCH$_2$C(CH$_3$)(COOH)CH$_2$OH (65)   HO(CH$_2$CH$_2$O)$_2$OH (35) | 1.69 | 120,000 |

The fluoroaliphatic group: Rf of the fluorine atom-containing surfactant used in the invention is in general a saturated monovalent aliphatic group. This may be linear or branched group or cyclic or combination thereof (such as an alkylcycloaliphatic group) if it is large enough to form a cyclic or combined group. The fluoroaliphatic skeletal chain may have heteroatoms, i.e., an oxygen atom bonded only to carbon atoms and/or a trivalent nitrogen atom and these heteroatoms ensure the formation of stable linkages between the fluorocarbon groups and do not impair the inert characteristics of the group Rf. The group Rf must have 3 to 20, preferably 6 to 12 carbon atoms and include not less than 30% by weight, preferably not less than 40% by weight of fluorine atoms bonded to carbon atoms for ensuring a sufficient effect of the presence thereof. At least three terminal carbon atoms of the group Rf are completely fluorinated. The terminal of the group Rf is, for instance, CF$_3$CF$_2$CF$_2$— and preferred Rf's are alkyl groups which are substantially and completely fluorinated such as those represented by the formula: C$_n$F$_{2n+1}$ (n is an integer of not less than 3).

If the fluorine atom content of the group Rf is less than 30% by weight, the intended purposes of the invention cannot be accomplished. A higher effect can be anticipated if fluorine atoms are localized at the terminal of the group Rf. The fluorine atom content can be increased even if the carbon atom number of the group Rf is not more than 2, but the total number of fluorine atoms is insufficient and this results in a low effect. A satisfactory effect cannot be anticipated even if the fluorine atom content in a copolymer is increased by increasing the rate of units derived from a monomer having a sufficiently fluorinated Rf group and not more than 2 carbon atoms since the fluorine atoms are not localized at the terminals thereof.

On the other hand, if the carbon atom number of the group Rf is not less than 21 and the fluorine atom content is high, the resulting copolymer has a low solubility in a solvent, while if the fluorine atom content is low, the localization of fluorine atoms is insufficient and any intended satisfactory effect cannot be anticipated in these cases.

The solubilization portion of the copolymer is a poly(oxyalkylene) group (OR')$_x$ and R' is preferably an alkylene group having 2 to 4 carbon atoms such as —CH$_2$CH$_2$—, —CH$_2$CH$_2$CH$_2$—, —CH(CH$_3$)CH$_2$— or —CH(CH$_3$)CH(CH$_3$)—. The oxyalkylene units in the foregoing poly(oxyalkylene) group may be the same as observed in poly(oxypropylene) group or may comprise at least two different oxyalkylene groups randomly distributed and thus they may be linear or branched oxypropylene and oxyethylene groups, or blocks of linear or branched oxypropylene units or blocks of oxyethylene units. At least one chain (such as —CONH—$C_6H_4$—NHCO— and/or —S—) may intervene or may be included in this poly(oxyalkylene) chain. If the chain has a valency of at least three, the chain can provide a branched oxyalkylene unit. To impart a desired solubility to the copolymer when it is added to the light-sensitive composition, the molecular weight of the poly(oxyalkylene) group preferably ranges from 250 to 2,500 and a sufficient effect of the invention can be accomplished if the molecular weight of the poly(oxyalkylene) group ranges from 600 to 2,500. If the molecular weight thereof ranges from 250 to 600, the copolymer has a desired solubility in a solvent, but the number of the poly(oxyalkylene) group-containing monomer units is too large and the localization of the groups Rf in the copolymer is insufficient. This does not results in satisfactory effect. On the contrary, the higher the molecular weight of the poly(oxyalkylene) group, the smaller the number of the poly(oxyalkylene) group-containing monomer units and the higher the degree of localization of the group Rfs in the copolymer. Thus, a sufficient effect can be anticipated. However, if the molecular weight thereof is greater than 2,500, the resulting copolymer has a low solubility in a solvent.

The foregoing copolymers used in the invention can be prepared by radical copolymerization of, for instance, fluoroaliphatic group-containing acrylates or fluoroaliphatic group-containing methacrylates with poly(oxyalkylene)acrylates or poly(oxyalkylene)methacrylates such as monoacrylates, diacrylates or mixture thereof. The molecular weight of the polyacrylate oligomer can be controlled by adjusting the concentration and activity of an initiator used, the concentrations of monomers used and the temperature of the polymerization reaction and by addition of a chain-transfer agent such as a thiol, e.g., n-octylmercaptan. As an example, a copolymer having the following repeating units can be obtained by copolymerizing a fluoroaliphatic group-containing acrylate, Rf-R''-$O_2$C—CH=$CH_2$ (wherein R'' is, for instance, a sulfonamidoalkylene, carbonamidoalkylene or alkylene group) such as $C_8F_{17}SO_2N(C_4H_9)CH_2CH_2O_2CCH$=$CH_2$ with a poly(oxyalkylene) monoacrylate, $CH_2$=CHC(O)(OR')$_x$-OCH$_3$:

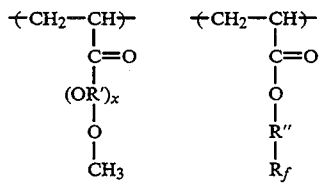

The foregoing fluoroaliphatic group-containing acrylates are disclosed in U.S. Pat. Nos. 2,803,615; 2,642,416; 2,826,564; 3,102,103; 3,282,905 and 3,304,278. The poly(oxyalkylene)acrylates used in the preparation of the foregoing copolymers and other acrylates useful for the preparation can be prepared by reacting commercially available hydroxypoly(oxyalkylene) materials such as Pluronic (trade name; available from Asahi Denka Kogyo K.K.), Adecapolyether (available from Asahi Denka Kogyo K.K.), Carbowax (available from Glyco Products Co.), Triton (available from Rohm and Haas Co.) and P.E.G. (available from Dai-Ichi Kogyo Seiyaku Co., Ltd.) with acrylic acid, methacrylic acid, acrylonitrile or acrylic anhydride by any known method. Alternatively, a polyacrylate copolymer having the following repeating units can be obtained by copolymerizing a Poly(oxyalkylene)diacrylate, $CH_2$=CHCO$_2$(R'O)$_x$COCH=$CH_2$ such as $CH_2$=CHCO$_2(C_2H_4O)_{10}(C_3H_6O)_{22}(C_2H_4O)_{1-0}$COCH=$CH_2$ with the foregoing fluoroaliphatic group-containing acrylate:

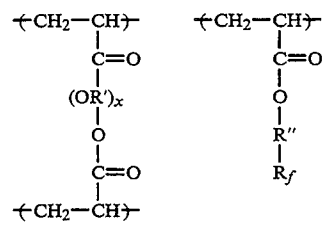

Other fluoroaliphatic group-containing unsaturated monomers carrying terminal ethylene groups suitable for the preparation of the copolymers used in the invention are disclosed in U.S. Pat. Nos. 2,592,069; 2,995,542; 3,078,245; 3,081,274; 3,291,843 and 3,325,163 and ethylenically unsaturated materials suitable for the preparation of the fluoroaliphatic group-containing unsaturated monomers carrying terminal ethylene groups are disclosed in U.S. Pat. No. 3,574,791.

The copolymers used in the invention are copolymers of fluoroaliphatic group-containing acrylates or fluoroaliphatic group-containing methacrylates with poly(oxyalkylene)acrylates or poly(oxyalkylene)methacrylates and comprise 35 to 50% by weight of the fluoroaliphatic group-containing monomer units on the basis of the weight of the oligomer and molecular weights ranging from 20,000 to 100,000. If the content of the fluoroaliphatic group-containing monomer units is less than 35% by weight, the ink-receptivity of the resulting lithographic printing plate during printing is impaired, while if it exceeds 50% by weight, the light-sensitive solution containing the same is liable to cause uneven coating layer when applying the same on a substrate.

Furthermore, if the molecular weight of the copolymer is less than 20,000, a satisfactory ink-receptivity-improving effect cannot be anticipated, while if it exceeds 100,000, the solubility thereof in a solvent is lowered.

The preferred amount of the fluorine atom-containing surfactant used in the invention ranges from 0.01 to 10% by weight on the basis of the light-sensitive composition (coating components except for solvents) and more preferably 0.05 to 5% by weight. If the amount thereof is less than 0.01% by weight, a desired effect ascribed thereto cannot be achieved, while if it exceeds 10% by weight, the resulting coated film cannot sufficiently be dried and the quality of the resulting light-sensitive material (such as developability) is adversely affected.

The light-sensitive composition of the present invention may further comprise a dye which is used for obtaining a visible image after exposure to light (exposed visible image) and for obtaining a visible image after development.

Such dyes preferably used are those which cause color tone change through reactions with free radicals or acids. The term "color tone change" herein means changes in color tone from colorlessness to a color, from a color to colorlessness or from a color to another color. Preferred dyes are those causing color tone change through formation of salts with acids.

Examples of discoloration agents causing color tone changes from a color to colorlessness or from a color to another color are triphenylmethane type, diphenylmethane type, oxazine type, xanthene type, iminonaphthoquinone type, azomethine type or anthraquinone type dyes represented by, for instance, Victoria Pure Blue BOH (available from Hodogaya Chemical Co., Ltd.) and naphthalenesulfonate thereof, Oil Blue #603 (available from Orient Chemical Industries, Ltd.), Patent Pure Blue (available from Sumitomo Mikuni Chemical Co., Ltd.), Crystal Violet, Brilliant Green, Ethyl Violet, Methyl Violet, Methyl Green, Erythrocin B, Basic Fuchsine, Malachite Green, Oil Red, m-cresol purple, Rhodamine B, Auramine, 4-p-diethylaminophenyliminonaphthoquinone and cyano-p-diethylaminophenyl acetanilide.

In addition, examples of discoloration agents causing color tone changes from colorlessness to a color include leuco dyes and primary or secondary arylamine dyes such as triphenylamine, diphenylamine, o-chloroaniline, 1,2,3-triphenylguanidine, naphthylamine, diaminodiphenylmethane, p, p'-bis-dimethyl-aminodiphenylamine, 1,2-dianilinoethylene, p,p',p''-tris-dimethyl-aminotriphenylmethane, p,p'-bisdimethylaminodiphenylmethylimine, p,p',p''-triamino-o-methyltriphenylmethane, p,p'-bis-dimethylaminodiphenyl-4-anilinonaphthylmethane and p,p',p''-triaminotriphenylmethane.

In particular, preferably used are triphenylmethane type and diphenylmethane type dyes, with triphenylmethane type ones being more preferred and Victoria Pure Blue BOH and naphthalenesulfonate thereof being particularly preferred.

The foregoing dyes are in general incorporated into the light-sensitive composition in an amount preferably ranging from about 0.5 to about 10% by weight and more preferably about 1 to 5% by weight on the basis of the weight of the total solid contents of the composition.

Moreover, various other additives may be added to the light-sensitive composition of the invention.

Such additives preferably used in the invention include, for instance, alkyl ethers (such as ethyl cellulose and methyl cellulose) and fluorine atom-containing surfactants other than those listed above as an essential component for the composition of the present invention and nonionic surfactants for improving the coating properties of the composition; plasticizers for imparting flexibility and wear resistance to the coated film of the composition (such as butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and oligomers and polymers of acrylic or methacrylic acid, with tricresyl phosphate being particularly preferred); commonly used stabilizers for diazo resins (such as phosphoric acid, phosphorous acid, pyrophosphoric acid, phenylphosphonic acid, oxalic acid, boric acid, p-toluenesulfonic acid, benzenesulfonic acid, p-hydroxybenzenesulfonic acid, 2-methoxy-4-hydroxy-5-benzoylbenzenesulfonic acid, 5-sulfosalicylic acid, 3-sulfophthalic acid, 4-sulfophthalic acid, 2-sulfoterephthalic acid, 5-sulfoisophthalic acid, isopropylnaphthalenesulfonic acid, t-butylnaphthalenesulfonic acid, malic acid, tartaric acid, dipicolinic acid, tricarballylic acid, homopolymers and copolymers of acrylic acid, homopolymers and copolymers of vinylphosphonic acid, homopolymers and copolymers of vinylsulfonic acid, 5-nitronaphthalene-1-phosphonic acid, 4-chlorophenoxymethyl phosphonic acid, sodium phenyl-methylpyrazolonesulfonate, citric acid, 2-phosphonobutane-1,2,4-tricarboxylic acid, 1-phosphonoethane-1,2,2-tricarboxylic acid and 1-hydroxyethane-1,1-disulfonic acid); development accelerators (such as higher alcohols, acid anhydrides and anionic surfactants); and agents for improving the ink receptivity of image areas (such as half esters of styrene-maleic anhydride copolymers with alcohols as disclosed in U.S. Pat. No. 4,294,905, novolak resins such as p-t-butylphenolformaldehyde resins, fatty acid esters of p-hydroxystyrene). The amount of these additives varies depending on the kinds of light-sensitive compositions to which they are added and purposes of the addition thereof, but in general ranges from 0.01 to 30% by weight on the basis of the weight of the total solid contents of the composition.

The light-sensitive composition detailed above is applied onto an appropriate substrate to give a PS plate.

Examples of substrates used are paper; paper laminated with plastic films (such as polyethylene, polypropylene and polystyrene films); plates of metals such as aluminum (inclusive of aluminum alloys), zinc and copper; plastic films such as cellulose diacetate, cellulose triacetate, cellulose propionate, polyethylene terephthalate, polyethylene, polypropylene, polycarbonate and polyvinyl acetal films; paper or plastic films which are laminated with foils of the foregoing metals or on which the foregoing metals are vapor-deposited; and steel plates plated with aluminum or chromium, with aluminum substrates and composite substrates coated with aluminum being particularly preferred.

Preferred aluminum materials are JIS A 1050 materials. In addition, these aluminum materials are preferably surface-treated for improving the water retention characteristics of the surface thereof and adhesion thereof to the light-sensitive layer subsequently applied.

Examples of surface-toughening methods are those generally known such as brush graining, ball graining, electrolytic etching, chemical etching, liquid honing, sand blasting and combinations thereof, with brush graining, electrolytic etching, chemical etching and liquid honing being preferred and surface-toughening methods including electrolytic etching being particularly preferred.

Preferred methods further include those comprising the steps of brush graining and subsequent electrolytically etching as disclosed in U.S. Pat. Nos. 4,476,006 and 4,477,317.

Electrolytic baths used in the electrolytic etching comprise aqueous solutions of acids, alkalis or salts thereof or aqueous solutions containing organic solvents, with electrolytes containing hydrochloric acid, nitric acid or salts thereof being particularly preferred. Moreover, the surface-toughened aluminum plates are, if necessary, desmutted with an aqueous solution of an acid or alkali. The aluminum plate thus obtained is desirably anodized. Particularly preferred anodization includes a treatment of the plate in a bath comprising sulfuric acid or phosphoric acid.

In addition, particularly preferred aluminum substrates include those further treated with silicates (sodium silicate and potassium silicate) as disclosed in U.S. Pat. Nos. 2,714,066 and 3,181,461; with potassium fluorozirconate as disclosed in U.S. Pat. No. 2,946,638; with a phosphomolybdate as disclosed in U.S. Pat. No. 3,201,247; with an alkyl titanate as disclosed in U.K. Patent No. 1,108,559; with a polyacrylic acid as disclosed in German Patent No. 1,091,433; with polyvinyl phosphonic acid as disclosed in German Patent No. 1,134,093 and U.K. Patent No. 1,230,447; with phosphonic acid as disclosed in J.P. KOKOKU No. Sho 44-6409; with phytic acid as disclosed in U.S. Pat. No. 3,307,951; with salts of hydrophilic organic polymers with divalent metals as disclosed in J.P. KOKAI Nos. Sho 58-16893 and Sho 58-18291; those hydrophilized by applying underlying coatings of sulfonic acid group-containing water-soluble polymers as disclosed in U.S. Pat. No. 4,578,342; and those dyed with acid dyes as disclosed in J.P. KOKAI No. Sho 60-64352. Examples of other hydrophilization treatments are silicate electrodeposition as disclosed in U.S. Pat. No. 3,658,662.

Moreover, substrates which are subjected to sealing treatment after graining and anodization are likewise preferably used. The sealing treatment is performed by, for instance, dipping aluminum plates in hot water or a hot aqueous solution containing an inorganic or organic salt or by exposing the plates to water vapor.

A substrate preferably used in the present invention can more specifically be prepared as follows. A JIS A 1050 aluminum plate comprising 0.1 to 0.5% iron, 0.03 to 0.3% silicon, 0.003 to 0.03% copper and 0.01 to 0.1% titanium is first etched by dipping in an alkali, preferably a 1 to 30% aqueous solution of, for instance, sodium hydroxide, potassium hydroxide, sodium carbonate or sodium silicate at 20° to 80° C. for 5 to 250 seconds. The etching solution may comprise aluminum in an amount of 1/5 times that of the alkali.

Then the plate thus subjected to the alkali-etching is neutralized and desmutted by immersing it in a 10 to 30% aqueous nitric acid or sulfuric acid solution at a temperature ranging from 20° to 70° C. for 5 to 250 seconds.

After cleaning the surface of the aluminum alloy plate, it is surface-toughened in the following manner. Brush graining and/or electrolytic etching are preferred as the surface-toughening treatment.

The temperature of the electrolyte is in general 10° to 60° C. The alternating current may be a rectangular wave, trapezoidal wave or sinusoidal wave current so far as the positive and negative polarities thereof are alternately exchanged and thus may be the usual commercial single-phase and three-phase alternating currents. In addition, the electrolytic etching is desirably performed at a current density of 5 to 100 A/dm$^2$ for 10 to 300 seconds.

The surface roughness of the aluminum alloy substrate used in the invention is controlled to the range of from 0.2 to 0.8 $\mu$m by adjusting the quantity of electricity during the surface-toughening treatment.

The aluminum alloy plate thus grained is preferably treated with a 10 to 50% hot sulfuric acid solution (40° to 60° C.) or a dilute alkali (such as sodium hydroxide) to remove the smut adhered to the surface thereof. When the smut is removed by an alkali, the plate is subsequently immersed in an acid (nitric acid or sulfuric acid) to wash and neutralize the same.

After the removal of the smut on the surface, an anodized layer is formed on the plate. The anodization may be carried out by any conventionally well known method, but sulfuric acid solutions are particularly preferably used as electrolytes for the anodization. Phosphoric acid solutions are useful electrolytes second to sulfuric acid solutions. Mixed acid solutions of sulfuric acid and phosphoric acid as disclosed in U.S. Pat. No. 4,229,226 are also useful.

In the sulfuric acid method, the anodization is in general performed using a direct current, but an alternating current may also be used. The aluminum alloy plate is electrolytically treated at a sulfuric acid concentration ranging from 5 to 30% and a temperature ranging from 20° to 60° C. for 5 to 250 seconds to form an oxide layer having a thickness of 1 to 10 g/m$^2$ on the surface thereof. The electrolyte used preferably comprises aluminum ions. The current density during the anodization preferably ranges from 1 to 20 A/dm$^2$. In the phosphoric acid method, the aluminum alloy plate is treated at a phosphoric acid concentration ranging from 5 to 50%, a temperature ranging from 30° to 60° C. and a current density of from 1 to 15 A/dm$^2$ for 10 to 300 seconds.

Further the aluminum substrate thus treated is desirably surface-treated with a silicate as disclosed in U.S. Pat. No. 2,714,066.

Moreover, the aluminum substrate may preferably have an underlying coating layer as disclosed in U.S. Pat. No. 4,578,342.

The light-sensitive composition described above is applied onto a substrate by dissolving a light-sensitive diazo resin, a polymer binder of the invention, a fluorine atom-containing surfactant of the invention and various optional additives in a proper solvent (such as methyl cellosolve, ethyl cellosolve, dimethoxyethane, diethylene glycol monomethyl ether, diethylene glycol-dimethyl ether, 1-methoxy-2-propanol, methyl cellosolve acetate, acetone, methyl ethyl ketone, methanol, dimethylformamide, dimethylacetamide, cyclohexanone, dioxane, tetrahydrofuran, methyl lactate, ethyl lactate, ethylene dichloride, dimethylsulfoxide or water) to give a coating solution of a light-sensitive composition, applying the coating solution onto a substrate and then drying the coated layer. The foregoing solvents may be used alone, but preferred are those comprising combinations of high boiling point solvents such as methyl cellosolve, 1-methoxy-2-propanol and methyl lactate with low boiling point solvents such as methanol and methyl ethyl ketone as described in U.S. Pat. No. 4,917,988.

The solid content of the light-sensitive composition upon application thereof desirably ranges from 1 to 50% by weight. In this case, the amount of the light-sensitive composition to be coated in general ranges from about 0.2 to 10 g/m$^2$ (weighed after drying) and preferably 0.5 to 3 g/m$^2$.

It is preferred to form, on the light-sensitive layer, a mat layer comprising projections independently formed.

The mat layer is formed in order to improve the adhesion under vacuum between a film carrying negative images and a PS plate during the contact exposure to light and to thus shorten the evacuation time and prevent conversion of fine half-tone dots into solid portions during exposure to light due to insufficient adhesion therebetween.

The mat layer can be applied by any method such as a method comprising dispersing solid powder on the light-sensitive layer and then heat-welding the powder as disclosed in U.S. Pat. No. 5,028,512 or a method comprising spraying an aqueous Solution of a polymer and then drying as disclosed in U.S. Pat. No. 4,557,994. Materials for forming such a mat layer are preferably those providing mat layers soluble in an alkali developer or capable of being removed by the developer.

The light-sensitive composition of the present invention applied onto a substrate is imagewise exposed to light through an original transparency carrying, for instance, solid images and half-tone dot images and then developed with an aqueous alkaline developer to give relief images negative with respect to the original.

Light sources preferably used for the imagewise exposure include, for instance, a carbon arc lamp, a mercury lamp, a xenon lamp, a metal halide lamp, a strobe lamp, ultraviolet light sources and laser light sources.

Developers used for the development of the PS plate of the invention may be any known one, but preferably include, for instance, those listed below. For instance, the developer comprises at least one alkaline agent and water as essential components.

Examples of alkaline agents used as one of the essential components of the developer include inorganic alkaline agents such as sodium silicate, potassium silicate, potassium hydroxide, sodium hydroxide, lithium hydroxide, sodium or ammonium salt of secondary or tertiary phosphoric acid, sodium metasilicate, sodium carbonate and ammonia; and organic amine compounds such as mono-, di- or trimethylamine, mono-, di- or triethylamine, mono-or di-isopropylamine, n-butylamine, mono-, di- or triethanolamine, mono-, di- or triisopropanolamine, ethyleneimine and ethylenediimine.

The content of these alkaline agents in the developer ranges from 0.05 to 10% by weight and preferably 0.5 to 5% by weight. If it is less than 0.05% by weight, the imagewise exposed PS plate is insufficiently developed, while if it exceeds 10% by weight, the printing properties of the resulting lithographic printing plate is adversely affected.

The developer used for the development of the PS plate of the invention may optionally comprise a particular organic solvent.

Preferred such organic solvents are those capable of dissolving or swelling unexposed portions (non-image areas) of the light-sensitive layer when they are added to the developer and having a solubility in water of not more than 10% by weight at ordinary temperature (20° C.). Specific examples thereof are carboxylic acid esters such as ethyl acetate, propyl acetate, butyl acetate, amyl acetate, benzyl acetate, ethylene glycol monobutyl acetate, butyl lactate and butyl levulinate; ketones such as ethyl butyl ketone, methyl isobutyl ketone and cyclohexanone; alcohols such as ethylene glycol monobutyl ether, ethylene glycol benzyl ether, ethylene glycol monophenyl ether, benzyl alcohol, methylphenylcarbinol, n-amyl alcohol and methylamyl alcohol; alkyl-substituted aromatic hydrocarbons such as xylene; and halogenated hydrocarbons such as methylene dichloride, ethylene dichloride and monochlorobenzene. These organic solvents may be used alone or in combination. Particularly effective organic solvents are ethylene glycol monophenyl ether and benzyl alcohol. The content of these organic solvents in the developer in general ranges from 0 to 20% by weight and, in particular, more satisfactory results can be anticipated when they are used in an amount ranging from 2 to 10% by weight.

The developer for developing the PS plate of the present invention may optionally comprise a water-soluble sulfite. The water-soluble sulfites are preferably alkali or alkaline earth matal salts of sulfurous acid such as sodium sulfite, potassium sulfite, lithium sulfite and magnesium sulfite. The content of these sulfites in the developer composition ranges from 0 to 4% by weight and preferably 0.1 to 1% by weight.

The developer may comprise an alkali-soluble pyrazolone compound, an alkali-soluble thiol compound and/or a hydroxyl group-containing aromatic compound such as methylresorcin in place of the foregoing water-soluble sulfite. These compounds may of course be used simultaneous with the water-soluble sulfite.

Furthermore, the developer may further comprise other additives such as antifoaming agents and water softeners. Water softeners usable in the present invention are, for instance, polyphosphates and aminopolycarboxylic acids. The optimum amount of these water softeners vary depending on the hardness and the amount of hard water used, but in general ranges from 0.01 to 5% by weight and preferably 0.01 to 0.5% by weight on the basis of the weight of the developer practically used.

The developer may further comprise an agent for solubilizing the foregoing organic solvent in water. Examples of such solubilizing agents are low molecular weight alcohols and ketones having a solubility in water higher than that of the organic solvent used for accomplishing the intended effects of the present invention. Specific examples of preferred alcohols and ketones include methanol, ethanol, propanol, butanol, acetone, methyl ethyl ketone, ethylene glycol monomethyl ether, ethylene glycol monoethyl ether, methoxybutanol, ethoxybutanol, 4-methoxy-4-methylbutanol and N-methylpyrrolidone.

It is also possible to use anionic surfactants and amphoteric surfactants. Specific examples of preferred surfactants are sodium isopropylnaphthalenesulfonate, sodium n-butylnaphthalene-sulfonate, sodium N-methyl-N-pentadecylaminoacetate and sodium lauryl sulfate. The amount of these solubilizing agents such as alcohols and ketones is preferably not more than about 30% by weight on the basis of the total weight of the developer.

The PS plate prepared using the light-sensitive composition of the invention may of course be subjected to a plate-making process according to the methods disclosed in J.P. KOKAI No. Sho 54-8002, Sho 55-115045 and Sho 59-58431. More specifically, the PS plate is developed, followed by desensitization after water-washing or desensitization without water-washing, or treatment with an aqueous solution containing an acid, or desensitization after treatment with an aqueous solution containing an acid. In the developing treatment of the PS plate of this type, the processing ability of the developer is reduced since the alkali concentration is reduced due to consumption of the alkaline aqueous solution in proportion to the quantity of PS plates processed or the alkali concentration is reduced due to absorption of air during operating an automatic developing machine over a long time. However, the processing ability of the developer may be recovered through addition of a replenisher as described in J.P. KOKAI No. Sho 54-62004. In this case, the replenisher is preferably supplemented by the methods disclosed in U.S. Pat. Nos. 4,882,246 and 5,053,796.

The foregoing plate-making process is preferably carried out using automatic developing machines as disclosed in J.P. KOKAI Nos. Sho 55-140843, Hei 2-7054 (=U.S. Pat. No. 4,952,958) and Hei 2-32357. A desensitizing gum is optionally applied to the plate as a final process for the plate-making and examples thereof preferably include those disclosed in J.P. KOKOKU Nos. Sho 62-16834 (=U.S. Pat. No. 4,253,999), Sho 62-25118 (=U.S. Pat. No. 4,268,613) and Sho 63-52600 and J.P. KOKAI Nos. Sho 62-7595 (=U.S. Pat. No. 4,731,119), Sho 62-11693 (=U.S. Pat. No. 4,719,172) and Sho 62-83194 (U.S. Pat. No. 4,762,772).

The light-sensitive composition of the present invention has sufficient developability even with so-called exhausted developers which comprise a large amount of components of light-sensitive layers dissolved therein and can provide a lithographic printing plate after plate-making process which has excellent printing durability and excellent ink receptivity during printing even after it is stored under high temperature and humidity conditions and/or exposed to light.

The present invention will hereinafter be explained in more detail with reference to the following Examples, but the present invention is not restricted to these specific Examples at all. In addition, the effects practically accomplished by the present invention will also be discussed in detail in comparison with Comparative Examples.

EXAMPLES 1 TO 6

The surface of a rolled plate of JIS A 1050 aluminum material having a thickness of 0.24 mm and comprising 99.5% aluminum, .0.01% copper, 0.03% titanium, 0.3% iron and 0.1% silicon was grained with a 20% by weight aqueous suspension of 400 mesh pumice stone (available from Kyoritsu Ceramic Materials Co., Ltd.) and a rotary nylon brush (6-10 nylon) and then sufficiently washed with water.

The aluminum plate was etched by immersing it in a 15% by weight aqueous sodium hydroxide solution (including 5% by weight of aluminum) so that the amount of aluminum dissolved is equal to 5 g/m² and washed with running water. Further, it was neutralized with a 1% by weight nitric acid solution and then electrically surface-toughened, in a 0.7% by weight aqueous nitric acid solution (including 0.5% aluminum in the form of aluminum ions) using a rectangular alternating wave voltage (current ratio r=0.90; the current wave form as disclosed in U.S. Pat. No. 4,087,341) having 9.3 V of cathodic voltage and 10.5 V of anodic voltage such that the quantity of electricity at the anode was 160 coulomb/dm². After water-washing, the plate was etched by immersing it in a 10% by weight aqueous sodium hydroxide solution maintained at 40° C. so that the amount of aluminum dissolved was 1 g/m² and washed with water. Then the plate was desmutted by immersing in a 30% aqueous sulfuric acid solution maintained at 50° C. and washed with water.

The plate was then subjected to a porous anodized layer-forming treatment in a 20% by weight aqueous solution of sulfuric acid (having an aluminum content of 0.8%, in the form of aluminum ions) maintained at 35° C. using a direct current. More specifically, the plate was electrolyzed at a current density of 13 A/dm² while adjusting the electrolyzation time so that the weight of the resulting anodized layer was 2.0 g/m² to give a substrate. After water-washing, the substrate was immersed in a 3% aqueous solution of sodium silicate at 70° C. for 30 seconds, washed with water and dried.

The reflection density of the aluminum substrate thus obtained was determined by a Macbeth RD 920 reflection densitometer and found to be 0.28 and the central line-average surface roughness was found to be 0.5μ.

An underlying coating solution-1 having the following composition was applied onto the aluminum plate thus obtained and dried at 80° C. for 30 seconds. The dry weight of the resulting underlying coating layer was 2 mg/m².

| Underlying Coating Solution-1 | |
|---|---|
| Component | Amount (g) |
| methyl methacrylate/ethyl acrylate/sodium 2-acrylamido-2-methylpropanesulfonate copolymer (molar ratio = 60/25/15) | 0.02 |
| methanol | 100 |

Then a light-sensitive solution having the following composition was applied onto the substrate with a bar coater and dried at 120° C. for 30 seconds. The dry weight of the resulting light-sensitive layer was 1.5 g/m².

| Light-sensitive Solution | |
|---|---|
| Component | Amount (g) |
| polyurethane resin (a) to (f) prepared in Preparation Example 1 to 6 | 5 |
| dodecylbenzenesulfonate of condensate of 4-diazodiphenylamine and formaldehyde | 1.2 |
| propane-1,2,3-tricarboxylic acid | 0.05 |
| phosphoric acid | 0.05 |
| 4-sulfophthalic acid | 0.05 |
| tricresyl phosphate | 0.25 |
| half ester of styrene/maleic anhydride copolymer with n-hexanol | 0.1 |
| naphthalenesulfonate of Victoria Pure Blue BOH | 0.18 |
| compound represented by: $[C_8F_{17}CH_2CH_2O]_{1.7}PO[OH]_{1.3}$ | 0.015 |
| fluorine atom-containing surfactant listed in Table 5 | 0.06 |
| 1-methoxy-2-propanol | 20 |
| methanol | 40 |
| methyl ethyl ketone | 40 |
| deionized water | 1 |

After the application of the light-sensitive layer, a solution having the following composition was applied through the electrostatic spraying onto the surface thereof and dried by exposing the surface to an atmosphere of 80° C. for 5 seconds to form a mat layer.

| Spraying Solution | |
|---|---|
| Component | Amount (g) |
| methyl methacrylate/ethyl acrylate/sodium 2-acrylamido-2-methylpropanesulfonate copolymer (molar ratio: 60/25/15) | 0.5 |
| Tartrazine | 0.01 |
| $H_2O$ | 100 |

Each mat had a height of 2 to 6μ and a width of 20 to 150μ, the density of the mats was about 100/m² and the amount of the mat layer coated was 0.1 g/m².

These PS plates were developed with a developer DN-3C (available from Fuji Photo Film Co., Ltd.) diluted with tap water to a volumetric ratio of 1:1 in a rate of 20 m² of the PS plate per one liter of the diluted developer to give an exhausted developer containing a large amount of the components of the light-sensitive layer dissolved therein. The exhausted developer was dropwise applied onto the PS plate through a dropping pipet and then the plate was washed with water after the lapse of a predetermined time period to determine the time (sec) required for complete dissolution (developing speed) of the unexposed portion.

In addition, these PS plates were imagewise exposed to light for one minute at a distance of 1 m using PS Light available from Fuji Photo Film Co., Ltd. Then these imagewise exposed PS plates were developed at 30° C. for 20 seconds using an automatic developing machine: STABLON 900N available from Fuji Photo Film .Co., Ltd. in which a developer DN-3C and a finisher: FN-2 both available from Fuji Photo Film Co., Ltd. and diluted with tap water to a volumetric ratio of 1:1 were charged in a developing tank and a finisher tank respectively. The PS plates thus produced were exposed to light rays from a fluorescent lighting of 600 Lx for 24 hours and further stored under high temperature and humidity conditions Of 35° C., 85% RH for 24 hours. Thereafter, each lithographic printing plate was fitted to a printing press SOR available from Heidelberg Company and printing operations were performed to determine ink receptivity during printing (the number of copies required till a copy on which complete images were transferred could be obtained) and the number of copies carrying complete images (printing durability). These results are summarized in the following Table 5.

COMPARATIVE EXAMPLES 1 TO 3

The same procedures used in Examples 1 to 6 were repeated except for using polyurethane resins (g) and (h) prepared in Comparative Preparation Examples 1 and 2 which were free of the diol component of Formula (1) as the polyurethane resin components and a copolymer having a fluoroaliphatic group-containing acrylate content of 30% by weight and a molecular weight of 15,000 as the fluorine atom-containing surfactant to give PS plates and to perform the same tests. The results thus obtained are summarized in Table 5.

As seen from these results, the light-sensitive composition of the present invention can ensure a high developing speed and can provide a lithographic printing plate having good ink receptivity during printing and good printing durability. However, the light-sensitive compositions comprising polyurethane resins free of diol components of Formula (1) exhibit insufficient developing speed and further the light-sensitive composition of Comparative Example 3 provides a lithographic printing plate having very low ink receptivity during printing. In Comparative Example 3, the polyurethane (a) comprising the diol component of Formula (1) was used, but a fluorine atom-containing surfactant used had a fluoroaliphatic group-containing acrylate content of 30%. by weight and a molecular weight of 15,000.

TABLE 5

| Monomer Used | Examples | | | | | | Comp. Ex. | | |
|---|---|---|---|---|---|---|---|---|---|
| | 1 | 2 | 3 | 4 | 5 | 6 | 1 | 2 | 3 |
| | Monomer Ratio (% by weight) | | | | | | | | |
| F.A.C. Surf.* | | | | | | | | | |
| A | 40 | 45 | 35 | 40 | 40 | 45 | 40 | 40 | 30 |
| B | 60 | 55 | | 60 | | | 60 | 60 | |
| C | | | 65 | | 60 | 55 | | | 70 |
| Molecular Weight ($\times 10^4$) | 3.5 | 4.0 | 6.0 | 3.5 | 4.0 | 5.5 | 3.5 | 3.5 | 1.5 |

TABLE 5-continued

| Monomer Used | Examples | | | | | | Comp. Ex. | | |
|---|---|---|---|---|---|---|---|---|---|
| | 1 | 2 | 3 | 4 | 5 | 6 | 1 | 2 | 3 |
| | Monomer Ratio (% by weight) | | | | | | | | |
| Polyurethane Resin Used | (a) | (b) | (c) | (d) | (e) | (f) | (g) | (h) | (a) |
| Developing Speed (sec) | 20 | 20 | 25 | 15 | 25 | 25 | 60 | 50 | 20 |
| Ink Receptivity During Printing (number) | 15 | 15 | 18 | 15 | 16 | 17 | 18 | 18 | 50 |
| Printing Durability ($\times 10^4$) | 20 | 20 | 20 | 20 | 18 | 18 | 20 | 20 | 20 |

*: fluorine atom-containing surfactant.
A: N-propyl-perfluorooctanesulfonamidoethyl acrylate
$C_8F_{17}SO_2N(C_3H_7)CH_2CH_2OCOCH=CH_2$
B: poly(oxyalkylene)acrylate
$CH_3O(C_3H_6O)_6COCH=CH_2$
C: poly(oxyalkylene)acrylate
$CH_3O(C_2H_4O)_{20}(C_3H_6O)_{20}COCH=CH_2$

I claim:

1. A light-sensitive composition which comprises, together in admixture, a sensitizing amount of a light-sensitive diazo resin, 50 to 95% by weight based on the light-sensitive composition of a polymer binder and 0.01 to 10% by weight based on the light-sensitive composition of a fluorine atom-containing surfactant wherein the polymer binder is a polyurethane resin having acidic hydrogen atom-containing substituents and comprising structural units derived from a diol represented by the following general formula (1), $$HO-(CH_2CH_2O)_n-H \quad (1)$$

wherein n is an integer ranging from 3 to 6, in an amount ranging from 10 to 80 mole % on the basis of the total diol components present in the resin, the acidic hydrogen atom-containing substituent is a group having an acid dissociation constant of not more than 7 and is a member selected from the group consisting of —COOH, —SO$_2$NHCOO—, —CONHSO$_2$—, —CONHSO$_2$—, —NHCONHSO$_2$—; and wherein the fluorine atom-containing surfactant is a copolymer of (i) an acrylate or methacrylate having a fluoroaliphatic group which has a carbon atom number of 3 to 20 and a fluorine atom content of not less than 30% by weight and in which at least three terminal carbon atoms are completely fluorinated, with (ii) poly(oxyalkylene)acrylate or poly(oxyalkylene)methacrylate, the copolymer containing the fluoroaliphatic group-containing acrylate or methacrylate units in an amount ranging from 35 to 50% by weight on the basis of the weight of the copolymer and the copolymer having a molecular weight ranging from 20,000 to 100,000.

2. The light-sensitive composition of claim 1, wherein the amount of the structural units derived from a diol of the formula (1) is from 20 to 50 mole % on the basis of the total diol components present in the resin.

3. The light-sensitive composition of claim 1, wherein the acid group content of the polyurethane resin is from 0.05 to 6 meq/g of the polyurethane resin.

4. The light-sensitive composition of claim 3, wherein the acid group content of the polyurethane resin is from 0.2 to 4 meq/g of the polyurethane resin.

5. The light-sensitive composition of claim 1 wherein the acidic hydrogen atom-containing substituent is —COOH.

6. The light-sensitive composition of claim 5 wherein the polyurethane resin has a basic skeleton derived from a reaction product of a diisocyanate compound represented by the following general formula (2), a diol compound represented by the general formula (1) and a carboxyl group-containing diol compound represented by the following general formulas (3), (4) or (5):

$$OCN-R^1-NCO \quad (2)$$

$$HO-R^3-\underset{\underset{COOH}{\overset{\overset{R^2}{|}}{|}}{C}}-R^4-OH \quad (3)$$

$$HO-R^3-\underset{\underset{COOH}{\overset{\overset{}{|}}{|}}{Ar}}-R^4-OH \quad (4)$$

$$HO-R^3-\underset{\underset{COOH}{\overset{\overset{}{|}}{|}}{N}}-R^4-OH \quad (5)$$

wherein $R^1$ represents a divalent aliphatic or aromatic hydrocarbon group which may have substituents selected from alkyl, alkenyl, aralkyl, aryl, alkoxy groups and/or halogen atoms, provided that $R^1$ may have other functional groups selected from ester, urethane, amido, ureido groups and/or carbon-carbon unsaturated bonds; $R^2$ represents a hydrogen atom, an alkyl group having 1 to 8 carbon atoms, an alkenyl group having 2 to 8 carbon atoms or an aryl group having 6 to 15 carbon atoms; $R^3$, $R^4$ and $R^5$ may be the same or different and each represents an alkylene group having 1 to 20 carbon atoms or an arylene group having 6 to 15 carbon atoms, provided that at least one of $R^3$, $R^4$ and $R^5$ optionally has at least one other functional groups selected from ester, urethane, amido, ureido groups or carbon-carbon unsaturated bonds and that two or three of $R^2$, $R^3$, $R^4$ and $R^5$ may be bonded to form a ring; Ar represents an aromatic group having 6 to 15 carbon atoms.

7. The light-sensitive composition of claim 6, wherein the polyurethane resin further comprises structural units derived from a diol compound selected from the group consisting of ethylene glycol, diethylene glycol, propylene glycol, dipropylene glycol, polypropylene glycol, neopentyl glycol, 1,3-butylene glycol, 1,4-butanediol, 1,5-pentanediol, 1,6-hexanediol, 2-butene-1,4-diol, 2-butyne-1,4-diol, 2,2,4-trimethyl-1,3-pentanediol, 2,2-diethyl-1,3-propanediol, 1,4-bis-β-hydroxyethoxycyclohexane, cyclohexanediol, cyclohexanedimethanol, tricyclo-decanedimethanol, hydrogenated bisphenol, A, diethyl 2,2-dimethylolmalonate, bis-(2-hydroxyethyl)sulfide, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinonedihydroxyethyl ether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenedicarbamate and bis(2-hydroxyethyl)isophthalate.

8. The light-sensitive composition of claim 6, wherein the diisocyanate compound is selected from the group consisting of 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, 3,3'-dimethylbiphenyl-4,4'-diisocyanate, hexamethylene diisocyanate, tri-methylhexamethylene diisocyanate, lysine diisocyanate, and dimeric acid diisocyanate, isophorone diisocyanate, 4,4'-methylenebis(cyclohexylisocyanate), methylcyclohexane-2,4 (or 2,6)-diisocyanate, 1,3bis(isocyanatomethyl)cyclohexane and diisocyanates obtained by reacting diols with diisocyanates.

9. The light-sensitive composition of claim 6, wherein the carboxyl group-containing diol compound is selected from the group consisting of 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, tartaric acid and N,N-bis(2-hydroxyethyl)-3-carboxy-propionamide.

10. The light-sensitive composition of claim 1 wherein the weight-average molecular weight of the polyurethane resin ranges from 5,000 to 200,000.

11. The light-sensitive composition of claim 1 wherein the poly(oxyalkylene) group has a molecular weight ranging from 600 to 2,500.

12. The light-sensitive composition of claim 1 wherein the fluoroaliphatic group: Rf has 6 to 12 carbon atoms.

* * * * *